(12) United States Patent
Groetsch

(10) Patent No.: US 7,567,597 B2
(45) Date of Patent: Jul. 28, 2009

(54) SEMICONDUCTOR DEVICE WITH A COOLING ELEMENT

(75) Inventor: Stefan Groetsch, Regensburg (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 10/522,518

(22) PCT Filed: Jun. 10, 2003

(86) PCT No.: PCT/DE03/01906

§ 371 (c)(1),
(2), (4) Date: Sep. 14, 2005

(87) PCT Pub. No.: WO2004/017476

PCT Pub. Date: Feb. 26, 2004

(65) Prior Publication Data

US 2006/0145333 A1    Jul. 6, 2006

(30) Foreign Application Priority Data

Jul. 30, 2002    (DE)    ................. 102 34 704

(51) Int. Cl.
  *H01S 3/04*    (2006.01)
  *H01S 5/00*    (2006.01)
(52) U.S. Cl. ................ 372/34; 372/35; 372/36; 372/50.1
(58) Field of Classification Search .......... 372/34, 372/35, 36, 50.1
See application file for complete search history.

(56) References Cited

U.S. PATENT DOCUMENTS

| 4,525,178 A | * | 6/1985 | Hall ................ 51/309 |
| 5,012,476 A | * | 4/1991 | Razeghi et al. ....... 372/45.012 |
| 5,105,430 A | | 4/1992 | Mundinger et al. | |
| 5,373,731 A | | 12/1994 | Tanaka et al. | |

(Continued)

FOREIGN PATENT DOCUMENTS

DE    4315580    11/1993

(Continued)

OTHER PUBLICATIONS

Johnson, WB. et al., "Diamond/Al Metal Matrix Composites Formed by the Pressureless Metal Infiltration Process", *J. Mater. Res.*, vol. 8, No. 5, pp. 1169-1173, XP-002304359, 1993.

(Continued)

*Primary Examiner*—Armando Rodriguez
(74) *Attorney, Agent, or Firm*—Fish & Richardson P.C.

(57) ABSTRACT

A semiconductor device comprising a semiconductor component, particularly a power laser diode bar, disposed on a cooling element, wherein the cooling element contains in its interior a cooling channel for conducting a coolant. The coolant channel comprises in at least one region microstructures for effective heat transfer to the coolant. The semiconductor component substantially completely overlaps the region of the cooling channel comprising the microstructures. Disposed between the semiconductor component and the cooling element is an intermediate support so arranged and configured that it compensates for mechanical stresses between the semiconductor component and the cooling element occurring as a result of differing thermal expansions of the semiconductor component and the cooling element. The material of the cooling element particularly preferably has a high modulus of elasticity such that the compensation takes place substantially within the elastic strain regime.

16 Claims, 1 Drawing Sheet

U.S. PATENT DOCUMENTS

| | | | |
|---|---|---|---|
| 5,783,316 A * | 7/1998 | Colella et al. | 428/660 |
| 5,812,570 A * | 9/1998 | Spaeth | 372/36 |
| 5,903,583 A | 5/1999 | Ullman et al. | |
| 7,000,684 B2 * | 2/2006 | Kenny et al. | 165/80.4 |
| 2002/0063329 A1 | 5/2002 | Horie et al. | |
| 2003/0099267 A1 | 5/2003 | Hennig et al. | |

FOREIGN PATENT DOCUMENTS

| | | |
|---|---|---|
| DE | 4335512 | 6/1995 |
| DE | 19605302 | 2/1996 |
| DE | 19506093 | 8/1996 |
| DE | 19820355 | 10/1998 |
| DE | 19821544 | 12/1999 |
| DE | 19956565 | 5/2001 |
| DE | 10061265 | 6/2002 |
| EP | 0 509825 | 10/1992 |
| EP | 0 771604 | 5/1997 |
| WO | WO 97/30494 | 8/1997 |
| WO | WO 97/35347 | 9/1997 |

OTHER PUBLICATIONS

Kerns, JA. et al., "Dymalloy: A Composite Substrate for High power Density Electronic Components", *The International Journal of Microcircuits and Electronic Packaging*, vol. 19, No. 3, XP 000639483, 1996.

Sun, Q. and Inal, QT., "Fabrication and Characterization of Diamond/Copper Composites for Thermal Management Substrate Applications", *Materials Science and Engineering*, B41, pp. 261-266, 1996.

* cited by examiner

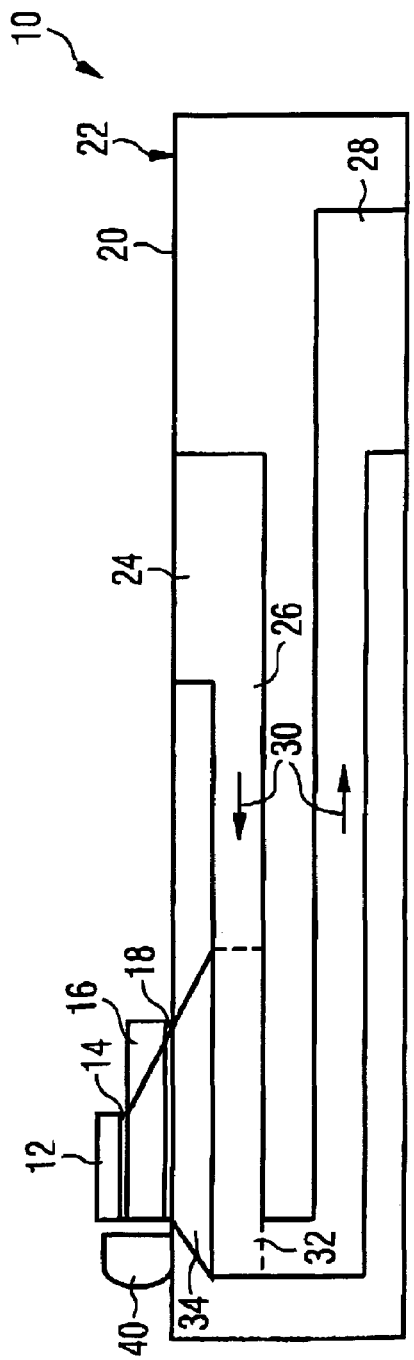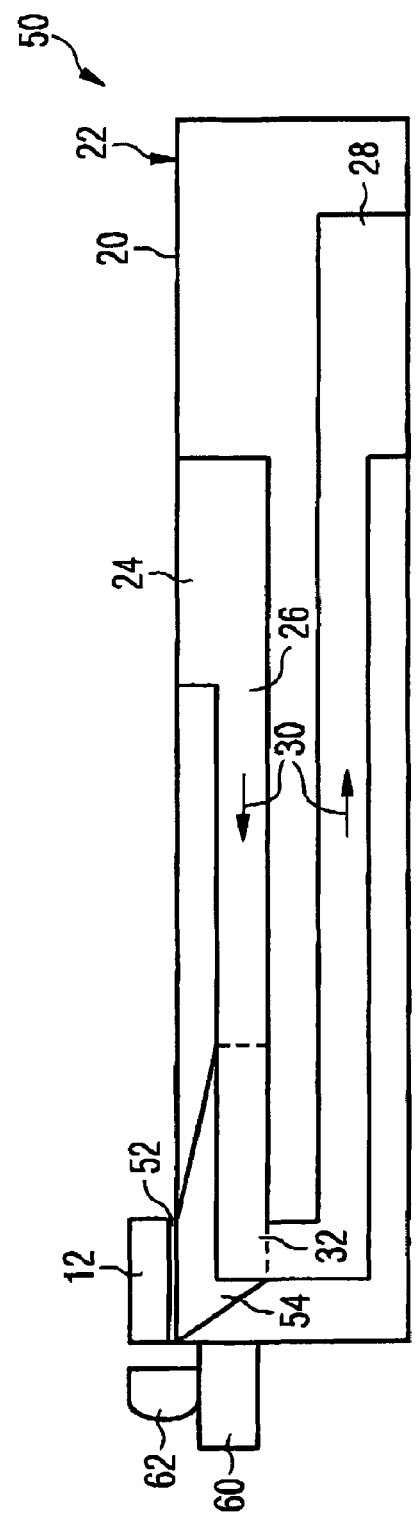
FIG. 1
FIG. 2
PRIOR ART

SEMICONDUCTOR DEVICE WITH A COOLING ELEMENT

CROSS-REFERENCE TO RELATED APPLICATIONS

This application is the National Stage of International Application No. PCT/DE2003/001906, filed Jun. 10, 2003, which claims the benefit of German Patent Application Ser. No. 10234704.2, filed on Jul. 30, 2002. The contents of both applications are hereby incorporated by reference in their entireties.

FIELD OF THE INVENTION

The invention concerns a semiconductor device comprising a semiconductor component, particularly a laser diode or a laser bar, disposed on a cooling element, wherein the cooling element contains in its interior a cooling channel serving to conduct a coolant and comprising in at least one region microstructures for effective heat transfer to the coolant.

BACKGROUND OF THE INVENTION

A known semiconductor device of this kind is depicted and described, for example, in patent DE 195 06 093 02. A schematic diagram of such a known semiconductor device is provided in FIG. 2. In that case, a microcooler 20 is fabricated by bonding together plural copper foils structured by etching. The individual layers form in conjunction a coolant inlet 24; a cooling channel 26, which conducts the coolant to the region of the microcooler 20 on which a power laser bar 12 is mounted; and a coolant outlet 28. The coolant flows along the arrow 30 from the inlet 24 to the outlet 28. Implemented in at least one region 32 are microstructures: narrow channels, for example. Particularly effective heat exchange takes place in that region because of turbulent flow of the coolant.

The laser bar 12 is soldered to the front edge of the microcooler by means of a soft solder 52—indium, for example. Mounting the bar 12 directly on the copper block 20 improves heat transfer from the laser bar to the cooler.

SUMMARY OF THE INVENTION

A disadvantage with respect to heat transfer to the coolant is the fact that no microstructured area can be placed directly under the laser bar 12 because of the seal. A region 54 of heat flow is therefore created, as illustrated in FIG. 2.

As a result of temperature-change loads of the kind that occur, for example, during cooling after the soldering step or when the laser bar is turned on and off, plastic deformation can occur in the soft solder—in the case of indium, for example, in response to temperature increases of as little as 5° C. to 7° C. This deformation can cause the connection to be partially or completely broken. A partially or completely interrupted connection delivers much poorer heat dissipation and an undesirable inhomogeneous power distribution in the laser bar.

The object underlying the present invention is, in a device of the species cited at the beginning hereof, to improve the thermal and mechanical coupling of the semiconductor component to the microcooler. The invention is particularly intended to provide both high heat dissipation efficiency and high mechanical stability of the arrangement.

This object is achieved by means of a semiconductor device as set forth below. Advantageous improvements of the semiconductor device also follow.

Although the discussion pertains to power laser bars, it will be understood by those skilled in the art that many of the below-described advantages of the solution according to the invention do not arise solely in connection with power laser bars. Rather, the invention can also be used to advantage with other semiconductor devices in which a semiconductor component is disposed on a microcooler whose thermal expansion coefficient is different from that of the semiconductor material, and which are exposed to substantial temperature changes during operation.

Apart from the aforesaid power laser bars, this also applies, for example, to power transistors and power light-emitting diodes, or for example to semiconductor devices that are used in the automotive industry, in aircraft or the like, and are there exposed to major outside temperature fluctuations.

According to the invention, it is provided, in a semiconductor device of the species cited at the beginning hereof, that disposed between the semiconductor component and the cooling element is an intermediate support that substantially completely overlaps the microstructure-comprising region of the cooling channel on the cooling element and that is so arranged and configured that it compensates for mechanical stresses occurring between the semiconductor and the cooling element as a result of temperature differences.

The intermediate support "substantially completely" overlaps the region comprising the microstructures as long as the region on which the semiconductor component is disposed overlaps. It is immaterial in this regard whether any electrical contact areas or the like project out of the overlap area.

The invention is therefore based on the idea of conducting the heat from the semiconductor component to the coolant by the shortest possible path and simultaneously guaranteeing the mechanical stability of the connection between the semiconductor component and the cooling element by means of an intermediate support that compensates for differing expansions.

It is advantageously provided in regard to the semiconductor device of the invention that the thermal expansion coefficient of the intermediate support is adapted to the thermal expansion coefficient of the semiconductor component and the intermediate support has a high modulus of elasticity such that said intermediate support compensates substantially within the elastic strain regime for mechanical stresses occurring as a result of temperature differences between the semiconductor component and the cooling element.

The intermediate support therefore equalizes the differential thermal expansion of the semiconductor component and the cooling element through completely reversible strain. Mechanical loading of the semiconductor component thus is largely prevented.

The intermediate support preferably has a higher thermal conductivity than copper, particularly a thermal conductivity that is 1.5 times higher, preferably three times higher than that of copper.

In a preferred embodiment of the invention, the semiconductor component is fastened to the intermediate support by means of a hard solder. Since according to the invention the intermediate support accommodates the differential thermal expansion, this function no longer has to be performed by a plastically deformable soft solder, as in the prior-art designs. This creates the freedom instead to use a high-temperature-resistant and cycle-stable hard solder to fasten together the component and the intermediate support.

In an advantageous improvement of the device according to the invention, the intermediate support is also fastened to the cooling element by means of a hard solder, for the same reasons.

In a particularly preferable manner, the intermediate support is fastened both to the cooling element and to the semiconductor component via a hard solder or a significantly higher-melting solder than indium.

Preferable candidates for use as hard-solder materials in this connection are AuSn, AuGe or AuSi. Higher-melting solders in the above sense are, for example, SnAgSb, SnCu or SnSb. In the present context, the use of AuSn as hard solder is currently preferred.

In a preferred embodiment of the semiconductor device of the invention, it is provided that the intermediate support is made of molybdenum, tungsten, a copper/molybdenum alloy or a copper/tungsten alloy. The copper content of the copper/molybdenum or copper/tungsten alloy is advantageously between about 10% and about 20%. These materials have a high modulus of elasticity of more than 250 GPa or even in excess of 300 GPa. They further offer a high yield stress and high temperature stability.

An intermediate support can be made of these materials not only in the form of foil, but also in the form of a layer that is sputter-deposited, vapor-deposited or galvanized onto the cooling element. It is understood that in the latter cases there is no need to fasten the intermediate support to the heat sink by hard soldering.

In another preferred embodiment of the invention, the intermediate support comprises a diamond composite material, particularly a diamond/metal matrix material. An intermediate support of this kind preferably contains at least one of the material combinations diamond/copper, diamond/cobalt and diamond/aluminum. These materials offer a higher thermal conductivity than copper—up to 600 W/mK—accompanied by expansion coefficients that are roughly the same as those of the semiconductor component. With the use of a copper/diamond intermediate support, the connecting layer to the semiconductor component preferably contains AuSn and the connecting layer to the cooling element preferably contains SnAgSb.

In a particularly preferred manner, the application of the structure of the invention is power semiconductor laser diode bars, particularly AlGaAs-based such bars.

In a preferred improvement of the semiconductor device according to the invention, a laser diode and a beam-collimating device, preferably a microlens, are disposed on one and the same outer surface of the cooling element. The beam-collimating device collimates the beam divergence of the laser diode. Without the beam-collimating device, the intermediate support can be shifted backward by no more than tan(beam divergence) without eliciting shadowing by the cooling element. Normally this is not sufficient for the bar plus the intermediate support to be positioned centrally enough to the microcooling structures.

A microlens for beam collimation is frequently also used in conventional devices of prior art. As shown in FIG. 2, owing to the conventional arrangement of the laser bar 12 at the edge of the microcooler, the microlens 62 is attached to the cooler 20 by means of an auxiliary mounting 60.

By contrast, no corresponding extra attaching part is needed with the device according to the invention.

In a preferred embodiment of the semiconductor device according to the invention, it is provided that the cooling element comprises plural stacked, areally interconnected layers, a portion thereof being structured, to form in the interior of the cooling element the cooling channels for conducting the coolant.

These layers of the cooling element are preferably formed of copper foils structured by etching.

Further advantages, advantageous embodiments, features and details of the invention will emerge from the following description of an embodiment example with the accompanying drawings.

BRIEF DESCRIPTION OF THE DRAWINGS

Only the elements essential for an understanding of the invention are illustrated in the drawings. Therein:

FIG. 1 is a schematic diagram of a sectional view of the embodiment example; and FIG. 2 is a schematic diagram of a sectional view of a semiconductor device according to the prior art (described in more detail earlier hereinabove).

DETAILED DESCRIPTION OF THE PREFERRED EMBODIMENTS

The semiconductor device 10 illustrated in section in FIG. 1 comprises a power laser diode bar 12, which is soldered onto a microoooler 20 having a coolant inlet 24 on its upper face, a cooling channel 26 in its interior and a coolant outlet 28 on its bottom face. The direction of flow of the coolant in the microcooler 20 is indicated by arrows 30.

Cooling channel 26 comprises, in a region 32 beneath power laser diode bar 12, microstructures, for example a plurality of channels each measuring 0.3 mm in width and height. Such microstructures cause turbulence in the flowing coolant by means of which the exchange of heat between the coolant and the microcooler can be configured very effectively.

The length of the microstructured region 32 in cooling channel 26 is at least equal to the length of power laser diode bar 12, which completely overlaps microstructured region 32 at least in this direction of extent. Preferably, as illustrated in FIG. 1, the length of microstructured region 32 is greater than that of power laser diode bar 12, thereby enlarging the cross section of the region in which the flow of heat from power laser diode bar 12 to microstructured region 32 takes place.

In a particularly preferred manner, microstructured region 32 is also exactly as wide as or wider than power laser diode bar 12.

Disposed between power laser diode bar 12 and microcooler 20 is an intermediate support 16, which is soldered onto the surface of and completely overlaps microcooler 20 above microstructured region 32.

Intermediate support 16 is composed, for example, of a copper/tungsten alloy with a copper content of 15%, and has a thickness of, for example, 250 μm.

The connection between power laser diode bar 12 and intermediate support 16 and the connection between intermediate support 16 and the surface 22 of microcooler 20 is made with AuSn, a solder that has substantially no plastic properties. These hard-solder layers are denoted in FIG. 1 by reference numerals 14 and 18.

Owing to its high modulus of elasticity, intermediate support 16 accommodates mechanical stresses occurring for example due to operation-induced heating and differential thermal expansion of the materials of power laser diode bar 12 and microcooler 20 (copper) within the elastic strain regime, so that the risk of damage to hard-solder layers 14, 18 and/or power laser diode bar 12 is reduced to the greatest possible extent.

Intermediate support 16 does have a lower thermal conductivity than a pure-indium soft-solder connection between the power laser diode bar and the microcooler, of the kind known in the prior art. However, this reduced thermal conductivity is more than offset by the much more favorable heat transfer from the power laser diode bar 12 to the microstructured region 32, so that, in the aggregate, improved heat flow is achieved between the power laser diode bar and the coolant compared to the conventional design illustrated in FIG. 2.

With the design illustrated in FIG. 1, the thermal resistance $R_{th}$ for a power laser diode bar 10 mm long is up to 40% lower than the values attained with conventional designs.

As shown in FIG. 1, a microlens 40 for beam collimation is disposed on the surface of micro-cooler 20 on which power laser diode bar 12 is mounted. Surface 22 advantageously offers a suitable mounting surface for this purpose in the immediate vicinity of the power laser diode bar. Auxiliary parts or add-ons to the microcooler of the kind necessary with known devices are not required with a device making use of the technical teaching disclosed in the foregoing.

Naturally, the explanation of the invention based on the embodiment example is not to be construed as limiting the invention thereto. Rather, the features of the invention disclosed in the preceding general part of the description, in the drawing and in the claims are essential to the practice of the invention both individually and in any combination that may appear suitable to one skilled in the art. For example, instead of the intermediate support 16 made of copper/tungsten alloy that is cited exemplarily in the embodiment example, which is preferably connected on its two sides respectively to cooling element 20 and to semiconductor component 12 by means of respective hard solders 14, 18, an intermediate support 16 comprising a diamond composite material can be used, as set out in the general part of the description. If a copper/diamond intermediate support is used, connecting layer 14 to semiconductor component 12 preferably contains AuSn and connecting layer 18 to cooling element 20 preferably contains SnAgSb.

The invention claimed is:

1. A semiconductor device comprising
   a semiconductor component comprising a power laser diode bar, disposed on a cooling element;
   said cooling element containing in its interior a cooling channel serving to conduct a coolant and comprising in at least one region microstructures for effective heat transfer to said coolant, wherein said semiconductor component substantially completely overlaps said region of said cooling channel comprising said microstructures, and disposed between said semiconductor component and said cooling element is an intermediate support so arranged and configured that it compensates for mechanical stresses between said semiconductor component and said cooling element occurring as a result of differing thermal expansions of said semiconductor component and said cooling element; and
   a beam-collimating device, wherein the laser diode bar and the beam-collimating device are disposed on a common surface of the cooling element.

2. The semiconductor device as set forth in claim 1, wherein said intermediate support has a high modulus of elasticity such that it compensates for the mechanical stresses substantially within the elastic strain regime.

3. The semiconductor device as set forth in claim 1, wherein said intermediate support has a higher thermal conductivity than copper, particularly a thermal conductivity that is about 1.5 times higher than that of copper.

4. The semiconductor device as set forth in claim 1, wherein the thermal expansion coefficient of said intermediate support is adapted to the thermal expansion coefficient of said semiconductor component.

5. The semiconductor device as set forth in claim 1, wherein said semiconductor component is connected by means of a hard solder to said intermediate support.

6. The semiconductor device as set forth in claim 1, wherein said intermediate support is connected by means of a hard solder to said cooling element.

7. The semiconductor device as set forth in claim 5, wherein the hard solder comprises a AuSn-based solder material.

8. The semiconductor device as set forth in claim 1, wherein said intermediate support is fabricated of molybdenum, tungsten, a copper/molybdenum alloy or a copper/tungsten alloy, preferably having a copper content of about 10 to about 20%.

9. The semiconductor device as set forth in claim 1, wherein said intermediate support comprises a diamond composite material, particularly a diamond/metal matrix material, which particularly contains at least one of the material combinations diamond/copper, diamond/cobalt and diamond/aluminum.

10. The semiconductor device as set forth in claim 1, wherein said cooling element is composed of plural stacked, areally interconnected layers, a portion thereof being structured, to form in the interior of said cooling element said cooling channel for conducting said coolant.

11. The semiconductor device as set forth in claim 10, wherein the layers of said cooling element are formed at least in part by the etching of structured copper foils.

12. The semiconductor device as set forth in claim 1, wherein the length of the micro structured region is at least equal to or greater than the length of said semiconductor component and said microstructured region completely overlaps said semiconductor component in the lengthwise direction.

13. The semiconductor device as set forth in claim 1, wherein the width of said microstructured region is equal to or greater than the width of said semiconductor component and said microstructured region completely overlaps said semiconductor component in the widthwise direction.

14. The semiconductor device as set forth in claim 1, wherein the beam-collimating device comprises a microlens.

15. A semiconductor device, comprising:
   a semiconductor component disposed on a cooling element, the cooling element comprising an interior cooling channel configured to conduct coolant, and comprising microstructures configured to transfer heat to the coolant; and
   an intermediate support disposed between the semiconductor component and the cooling element, the intermediate support being configured to compensate for mechanical stresses between the semiconductor component and the cooling element as a result of differing thermal expansions of the semiconductor component and the cooling element,
   wherein the semiconductor component substantially completely overlaps a region of the cooling channel that comprises the microstructures, and the intermediate support is formed of a diamond/metal matrix material that comprises at least one metal selected from the group consisting of copper, cobalt, and aluminum.

16. The semiconductor device as set forth in claim 6, wherein the hard solder comprises a AuSn-based solder material.

\* \* \* \* \*

UNITED STATES PATENT AND TRADEMARK OFFICE
CERTIFICATE OF CORRECTION

PATENT NO. : 7,567,597 B2  
APPLICATION NO. : 10/522518  
DATED : July 28, 2009  
INVENTOR(S) : Stefan Grötsch Page 1 of 1

It is certified that error appears in the above-identified patent and that said Letters Patent is hereby corrected as shown below:

Column 6  
Line 13, Claim 8, replace "10" with --10%--

Signed and Sealed this

Sixth Day of October, 2009

David J. Kappos  
*Director of the United States Patent and Trademark Office*